(12) United States Patent
Kamada et al.

(10) Patent No.: US 7,736,830 B2
(45) Date of Patent: Jun. 15, 2010

(54) METHOD FOR FORMING CIRCUIT PATTERN

(75) Inventors: Akihiko Kamada, Yasu (JP); Norio Sakai, Moriyama (JP); Issei Yamamoto, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 4 days.

(21) Appl. No.: 12/198,540

(22) Filed: Aug. 26, 2008

(65) Prior Publication Data

US 2008/0305425 A1 Dec. 11, 2008

Related U.S. Application Data

(63) Continuation of application No. PCT/JP2007/051525, filed on Jan. 30, 2007.

(30) Foreign Application Priority Data

Feb. 27, 2006 (JP) .............................. 2006-051347

(51) Int. Cl.
*G03G 13/20* (2006.01)
(52) U.S. Cl. ............................... 430/120.2; 430/124.14
(58) Field of Classification Search .............. 430/120.2, 430/31, 97, 124.14
See application file for complete search history.

(56) References Cited

U.S. PATENT DOCUMENTS 4,851,320 A * 7/1989 Stein ..................... 430/124.14

2006/0172219 A1 * 8/2006 Stasiak et al. ............... 430/117

FOREIGN PATENT DOCUMENTS

| JP | 61-110486 | 5/1986 |
|---|---|---|
| JP | 62-290102 | 12/1987 |
| JP | 63-261796 | 10/1988 |
| JP | 6-69618 | 3/1994 |
| JP | 11-307911 | 11/1999 |
| JP | 11-312858 | * 11/1999 |
| JP | 11-312859 | 11/1999 |

OTHER PUBLICATIONS

AIPN Japanese Patent Office machine-assisted translation of JP 11-312858 (pub. Nov. 1999).*
AIPN Japanese Patent Office machine-assisted translation of JP 11-307911 (pub. Nov. 1999).*
International Search Report, mailed May 15, 2007.
Written Opinion with English language translation, mailed May 15, 2007.

* cited by examiner

*Primary Examiner*—Janis L Dote
(74) *Attorney, Agent, or Firm*—Keating & Bennett, LLP

(57) ABSTRACT

A method for forming circuit patterns having different resistances. The method includes (1) a first step of forming a first toner image using a first toner and a second toner image using a second toner, each by electrophotography, the first toner containing a resistive material, the second toner having a resistance different from that of the first toner; and (2) a second step of transferring and fixing the first toner image and the second toner image to an object to be printed such as a ceramic green sheet, to form a circuit pattern.

12 Claims, 11 Drawing Sheets

METHOD FOR FORMING CIRCUIT PATTERN

CROSS-REFERENCE TO RELATED APPLICATIONS

This is a continuation under 35 U.S.C. §111(a) of PCT/JP2007/051525 filed Jan. 30, 2007, and claims priority of JP2006-051347 filed Feb. 27, 2006, both incorporated by reference.

BACKGROUND

1. Technical Field

The present disclosure relates to a method for forming a circuit pattern and, more particularly, to a method for forming a circuit pattern by printing, utilizing electrophotography.

2. Background Art

A ceramic multilayer board may include a resistance pattern serving as a resistance element and a circuit pattern including wiring serving as an inductor and/or a capacitor electrode.

For example, a resistance pattern inside a ceramic multilayer board is formed by applying resistive paste to a ceramic green sheet, forming a green laminate composed of the ceramic green sheet and another ceramic green sheet, and firing the green laminate.

A resistance pattern on the surface of a ceramic multilayer board is generally formed by baking resistive paste applied to a fired ceramic multilayer board. A resistance pattern on the surface of a ceramic multilayer board may also be formed by firing resistive paste applied to a green laminate.

The resistance of a resistance pattern may be controlled by the following two methods, alone or in combination.

A first method relies on dimensional control of a resistance pattern. For example, to increase the resistance, the electrode gap is increased, the electrode width is reduced, or the thickness of a printed film is reduced. The reverse of these processes may be performed to reduce the resistance.

A fired thick-film resistor is usually trimmed with a laser to control the resistance with high precision (see, for example, Patent Document 1).

According to a second method, the resistance of a resistance pattern is controlled by the resistance of resistive paste.

With a reduction in the size and the profile of components, the resistance pattern area is also being reduced. It is therefore extremely difficult to alter the resistance of a resistance pattern by altering the dimensions of the resistance pattern. Under these circumstances, the method may be used in which a plurality of resistive pastes having different resistances may be appropriately combined to achieve a desired resistance.

However, this method requires many types of resistive paste having different resistances, thus requiring complicated inventory management and considerable management costs.

Thus, to avoid the complicated management of resistive pastes, a limited number of pastes having different resistances may be blended to provide a desired resistance. Such a blend method, involving a stock of only a limited number of resistive pastes having different resistances (for example, 10, 100, 1000, and 10000 ohms per square), has been widely used (see, for example, Patent Document 2).

Patent Document 1: Japanese Unexamined Patent Application Publication No. 63-261796

Patent Document 2: Japanese Unexamined Patent Application Publication No. 62-290102

However, additional problems still remain to be solved.

A ceramic multilayer board includes many ceramic layers to integrate various circuits. Resistance patterns having different resistances are often integrated on the same layer. To form resistance patterns having different resistances, resistive paste and a printing plate must be replaced by another resistive paste and another printing plate for each of the resistance patterns.

For example, to prepare five resistance patterns having different resistances on a single layer, even the blend method described above needs up to five blends of resistive pastes and five printing plates, thus requiring five cycles of printing while replacing the printing plate and the resistive paste for every resistance pattern.

SUMMARY

In view of the situations described above, it would be desirable to provide an improved method for forming a circuit pattern having a desired resistance without difficulty.

The disclosed methods for forming a circuit pattern solve the problems described above.

A method for forming a circuit pattern includes (1) a first step of forming a first toner image using a first toner and a second toner image using a second toner each by electrophotography, the first toner containing a resistive material, the second toner having a resistance different from that of the first toner; and (2) a second step of transferring and fixing the first toner image and the second toner image to an object to be printed to form the circuit pattern.

Thus, the first toner image and the second toner image, which has a resistance different from that of the first toner image, can be appropriately combined to control the resistance of a circuit pattern composed of the first toner image and the second toner image.

In the first step, the second toner may contain a different amount of the same resistive material as the first toner or may contain a resistive material different from that of the first toner. Furthermore, the first toner image and the second toner image may be formed at the same time or at different times.

The second step may be started after the initiation of the first step and may be started before the completion of the first step. For example, after the first toner image is formed, the first toner image may be transferred or fixed before the formation of the second toner image.

Preferably, the first toner is conductor-containing toner in which resistor particles are coated with a resin layer. The second toner is glass-containing toner in which glass particles are coated with a resin layer. More preferably, the resin layers of the conductor-containing toner and/or the glass-containing toner contain a charge control agent.

The conductor-containing toner and the glass-containing toner can be combined to increase the possible resistance range of a circuit pattern.

Preferably, the first toner is toner for forming a low-resistance pattern. This toner is composed of resistor particles, glass frit disposed on the surface of the resistor particles, and a resin layer disposed around the resistor particles. Preferably, the second toner is toner for forming a high-resistance pattern. This toner has the same structure as the toner for forming a low-resistance pattern, except that the amount of the glass frit is larger than that in the toner for forming a low-resistance pattern. More preferably, the resin layer of the toner for forming a low-resistance pattern and/or the toner for forming a high-resistance pattern contains a charge control agent.

The toner for forming a low-resistance pattern and the toner for forming a high-resistance pattern can be combined to control the resistance of a circuit pattern minutely and easily.

In the first step, preferably, the first toner and the second toner are deposited on a common photoreceptor to form the first toner image and the second toner image, respectively. In the second step, preferably, the first toner image and the second toner image formed on the common photoreceptor are transferred at the same time and are fixed to the object to be printed.

The formation of the first toner image and the second toner image on the common photoreceptor allows the first toner image and the second toner image to be aligned with high precision. Furthermore, use of the common photoreceptor reduces the number of components and thereby enhances miniaturization of the apparatus.

In the first step, preferably, the first toner is used to form the first toner image on a photoreceptor, and the second toner is used to form the second toner image on another photoreceptor. In the second step, preferably, the first toner image and the second toner image are transferred to a common intermediate transfer body, and the first toner image and the second toner image transferred to the intermediate transfer body are then transferred to the object to be printed.

Thus, the first toner image and the second toner image can easily overlap each other.

In the second step, preferably, the first toner image is transferred and fixed, and then the second toner image is transferred and fixed.

When the first toner image and the second toner image are separately transferred and fixed, the first toner forming the first toner image and the second toner forming the second toner image are mixed negligibly. Thus, a first circuit pattern element, which is formed by transferring and fixing the first toner image, and a second circuit pattern element, which is formed by transferring and fixing the second toner image, can independently be provided with a desired resistance without difficulty.

In one preferred aspect of a method for forming a circuit pattern, the first circuit pattern element is connected between a pair of electrodes disposed on the object to be printed, and the second circuit pattern element is placed on at least part of the first circuit pattern element.

After the formation of a circuit pattern, the second circuit pattern element may be partly removed to finely adjust the resistance of the circuit pattern.

In another preferred aspect of a method for forming a circuit pattern, (a) a first circuit pattern element, which is formed by transferring and fixing the first toner image, is connected to one of a pair of electrodes disposed on the object to be printed, (b) a second circuit pattern element, which is formed by transferring and fixing the second toner image, is connected to the other of the pair of electrodes disposed on the object to be printed, and (c) the second circuit pattern element is placed on at least part of the first circuit pattern element.

Since the first circuit pattern element and the second circuit pattern element are connected in series between a pair of electrodes, the resistance of the circuit pattern can be estimated easily.

In another preferred aspect of a method for forming a circuit pattern, a plurality of first pieces of a first circuit pattern element, which are formed by transferring and fixing the first toner image, and a plurality of second pieces of a second circuit pattern element, which are formed by transferring and fixing the second toner image, are alternately placed such that the first pieces and the second pieces are adjacent to each other over the object to be printed.

This structure can reduce the thickness of the circuit pattern. In addition, the structure can achieve substantially uniform resistance of the circuit pattern over the object to be printed.

Preferably, in the first step, the first toner image and the second toner image are layered such that the first toner and the second toner are mixed.

The mixing of the first toner and the second toner can make the resistance of a circuit pattern substantially uniform over the object to be printed.

Preferably, the object to be printed is a ceramic green sheet.

This allows a circuit pattern to be formed on a ceramic green sheet efficiently and precisely, as compared with a circuit pattern formed by applying resistive paste to a ceramic green sheet.

Preferably, a method for forming a circuit pattern further includes a third step of laminating a plurality of ceramic green sheets, including the ceramic green sheet on which the circuit pattern is formed, to form a laminate; and a fourth step of firing the laminate together with the circuit pattern.

In this case, the circuit pattern is baked while the ceramic green sheet is fired. Thus, a circuit pattern of consistent quality can be formed efficiently.

A method for forming a circuit pattern as described herein can easily provide a circuit pattern having a desired resistance.

Other features and advantages will become apparent from the following description of embodiments, which refers to the accompanying drawings.

DETAILED DESCRIPTION

Figure 1A:
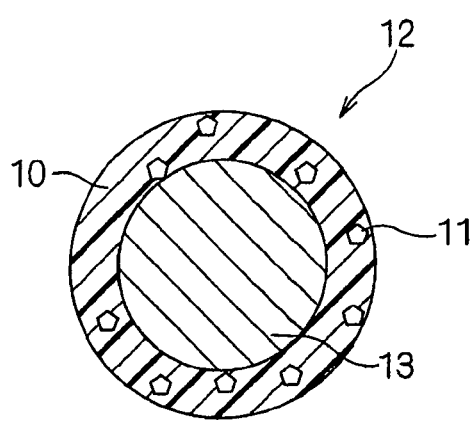
FIGS. 1(A) and 1(B) are schematic views of toner structures. (Example 1-1)

Reference Numerals
1 and 2 toner
4, 4x, and 4y ceramic green sheet
6, 6a, 6b, 6x, and 6y electrode
10 resin layer
11 charge control agent (charging control agent)
12 conductor toner
13 resistor particle (resistor-containing toner)
14 glass toner (glass-containing toner)
15 glass particle
16 low-resistance toner (toner for forming a low-resistance pattern)
17 glass frit
18 high-resistance toner (toner for forming a high-resistance pattern)
20, 20a, 20b, and 20s electrophotographic apparatus
21, 22, and 24 developing unit
30 photoreceptor
32 charger
34 exposure apparatus
36 cleaner
40, 41a, and 41b electrophotography engine unit
42 and 43 intermediate transfer body
44, 44a, 44b, and 45 transfer apparatus
46 fixing apparatus
50 and 60 resistance pattern (circuit pattern)
70, 70s, and 70t first resistance pattern element (first circuit pattern element)
72, 72a, 72b, 72s, and 72t second resistance pattern element (second circuit pattern element)
81 and 82 toner
84 resistance pattern (circuit pattern)

Embodiments will be described below with reference to FIGS. 1 to 14.

The following describes the formation of a circuit pattern of a resistance element (hereinafter referred to as "resistance pattern") inside a ceramic multilayer board. A resistance pattern is formed by electrophotography, that is, by forming a toner image with toner that contains a resistive material, and transferring and fixing the toner image to a ceramic green sheet which is an object to be printed. At least two types of toner that have different resistances after firing can be appropriately combined to form a resistance pattern having a desired resistance.

First, different types of toner that have different resistances for use in the formation of a resistance pattern will be described below with reference to FIGS. 1(A), (B) and 2(A), (B).

Embodiment 1-1

Figure 1B:
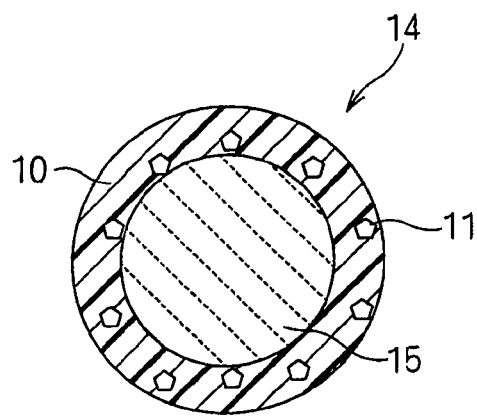

As examples of toner that have different resistances for use in the formation of a resistance pattern, FIGS. 1(A) and 1(B) schematically illustrate conductor toner 12 and glass toner 14.

As illustrated in FIG. 1(A), in the conductor toner 12, a resistor particle 13 formed of a resistive material, such as ruthenium oxide, is coated with a resin layer 10, which contains a charge control agent 11.

The conductor toner 12 may be produced as follows. First, a ruthenium oxide powder having an average particle size of 6.1 μm, a styrene acrylic resin, and an azo charge control agent are mixed in a hybridization system (Nara Machinery Co., Ltd.) at a weight ratio of 90:9.9:0.1 to produce conductor toner 12 having an average particle size of 7.3 μm. The conductor toner 12 and a ferrite carrier having an average particle size of 60 μm are mixed at a weight ratio of 20:80 to produce a developer that contains the conductor toner 12 and the ferrite carrier.

As illustrated in FIG. 1(B), in the glass toner 14, a glass particle 15 formed of a resistive material, such as borosilicate glass, is coated with a resin layer 10, which contains a charge control agent 11.

The glass toner 14 may be produced as follows. First, $B_2O_3$, $SiO_2$, BaO, CaO, and $Al_2O_3$ are prepared as raw materials of irreducible borosilicate glass frit. These materials are mixed at a molar ratio of 36.0:31.7:18.0:9.3:5.0. The mixture is melted at a temperature in the range of 1200° C. to 1350° C. and is then quenched in pure water. The quenched mixture is pulverized with a vibrating mill into irreducible glass frit having an average particle size of 1 μm or less. The glass frit, a styrene acrylic resin, and an azo charge control agent are mixed in a hybridization system (Nara Machinery Co., Ltd.) at a weight ratio of 90:9.9:0.1 to produce glass toner 14 having an average particle size of 8.2 μm. The glass toner 14 and a ferrite carrier having an average particle size of 60 μm are mixed at a weight ratio of 20:80 to produce a developer that contains the glass toner 14 and the ferrite carrier.

Embodiment 1-2

Figure 2A:
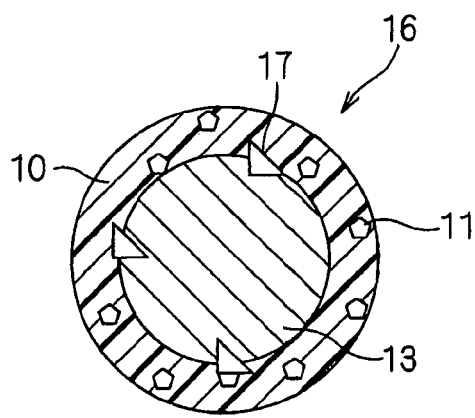
FIGS. 2(A) and 2(B) are schematic views of toner structures. (Example 1-2)
Figure 2B:
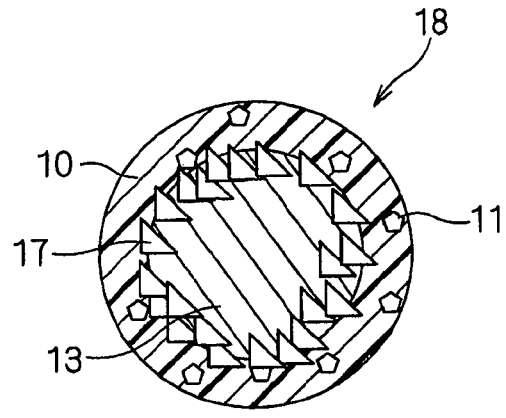

As other types of toner that have different resistances for use in the formation of a resistance pattern, FIGS. 2(A) and 2(B) schematically illustrate low-resistance toner 16 having a relatively low resistance and high-resistance toner 18 having a relatively high resistance, respectively.

As illustrated in FIG. 2(A), in the low-resistance toner 16, a resistor particle 13 formed of a resistive material, such as ruthenium oxide, contains glass frit 17 embedded in the surface thereof, and is coated with a resin layer 10, which contains a charge control agent 11.

The low-resistance toner 16 may be produced as follows. $B_2O_3$, $SiO_2$, BaO, CaO, and $Al_2O_3$ are prepared as raw materials of irreducible borosilicate glass frit. These materials are mixed at a molar ratio of 36.0:31.7:18.0:9.3:5.0. The mixture is melted at a temperature in the range of 1200° C. to 1350° C. and is then quenched in pure water. The quenched mixture is pulverized with a vibrating mill into irreducible glass frit having an average particle size of 1 μm or less. This irreducible glass frit and a ruthenium oxide powder are mixed in a hybridization system (Nara Machinery Co., Ltd.) at a weight ratio of 10:90 to produce a composite powder that contains the irreducible glass frit embedded in the surface of the ruthenium oxide powder. The composite powder, a styrene acrylic resin, and an azo charge control agent are mixed in a hybridization system (Nara Machinery Co., Ltd.) at a weight ratio of 90:9.9:0.1 to produce low-resistance toner 16 having an average particle size of 8.2 μm. The low-resistance toner 16 and a ferrite carrier having an average particle size of 60 μm are mixed at a weight ratio of 20:80 to produce a developer that contains the low-resistance toner 16 and the ferrite carrier.

As illustrated in FIG. 2(B), in the high-resistance toner 18, a resistor particle 13 formed of a resistive material, such as ruthenium oxide, contains glass frit 17 embedded in the surface thereof, and is coated with a resin layer 10, which contains a charge control agent 11. The high-resistance toner 18 has the same structure as the low-resistance toner 16, but contains the glass frit 17 in an amount different from the low-resistance toner 16. That is, the resistance of toner increases with the content of the glass frit 17. The resistor particle of the high-resistance toner 18 may be different from the resistor particle of the low-resistance toner 16. However, since the resistance can be controlled by the glass frit content, these resistor particles are preferably of the same type and the same size in terms of management costs.

The high-resistance toner 18 may be produced as follows. First, $B_2O_3$, $SiO_2$, BaO, CaO, and $Al_2O_3$ are prepared as raw materials of irreducible borosilicate glass frit. These materials are mixed at a molar ratio of 36.0:31.7:18.0:9.3:5.0. The mixture is melted at a temperature in the range of 1200° C. to 1350° C. and is then quenched in pure water. The quenched mixture is pulverized with a vibrating mill into irreducible glass frit having an average particle size of 1 μm or less. This irreducible glass frit and a ruthenium oxide powder are mixed in a hybridization system (Nara Machinery Co., Ltd.) at a weight ratio of 30:70 to produce a composite powder that contains the irreducible glass frit embedded in the surface of the ruthenium oxide powder. The composite powder, a styrene acrylic resin, and an azo charge control agent are mixed in a hybridization system (Nara Machinery Co., Ltd.) at a weight ratio of 90:9.9:0.1 to produce high-resistance toner 18 having an average particle size of 8.2 μm. The high-resistance toner 18 and a ferrite carrier having an average particle size of 60 μm are mixed at a weight ratio of 20:80 to produce a developer that contains the high-resistance toner 18 and the ferrite carrier.

While the charge control agent is dispersed within the resin in this embodiment, the charge control agent may also be dispersed on the surface of the resin.

Electrophotographic apparatus for forming a toner image and transferring and fixing the toner image will be described below with reference to FIGS. 3 to 6.

Embodiment 2-1

Figure 3:
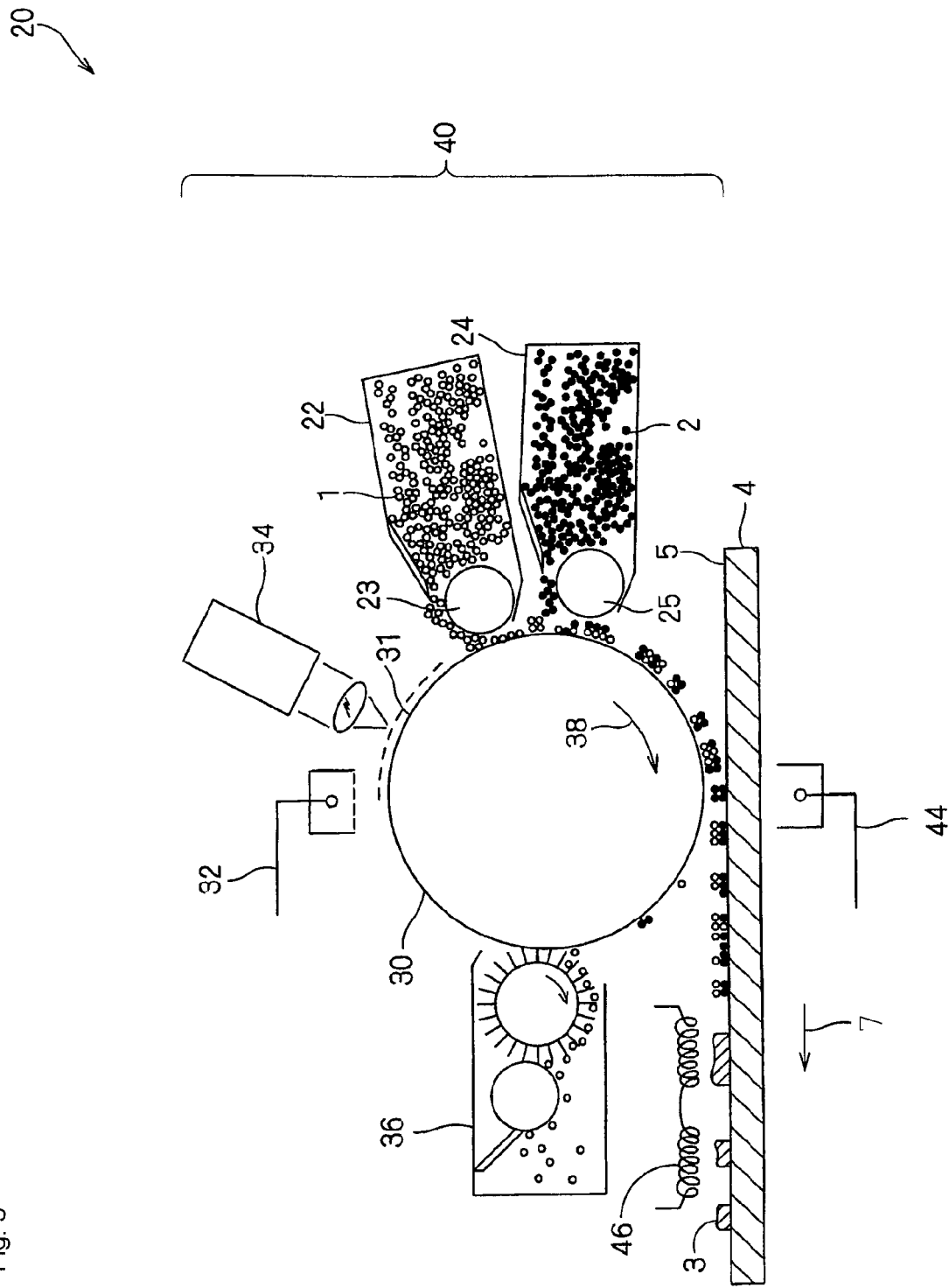
FIG. 3 is a schematic view of an electrophotographic printer. (Example 2-1)

FIG. 3 schematically illustrates the structure of a single-drum-type electrophotographic apparatus 20.

The electrophotographic apparatus 20 includes an electrophotography engine unit 40, a transfer apparatus 44, and a fixing apparatus 46.

The electrophotography engine unit 40 includes a charger 32, an exposure apparatus 34, a first developing unit 22, a second developing unit 24, and a cleaner 36 each disposed around a drum-type photoreceptor 30. The charger 32 electrifies the surface 31 of the photoreceptor 30. For example, the charger 32 may be a corona charger. The exposure apparatus 34 irradiates the surface 31 of the photoreceptor 30 with light to form a desired latent image pattern (not shown). The first developing unit 22 supplies first toner 1 containing a resistive material onto the latent image pattern formed on the photoreceptor 30 to develop a first toner image. The second developing unit 24 supplies second toner 2 containing a resistive material onto the latent image pattern formed on the photoreceptor 30 to develop a second toner image. The cleaner 36 cleans the surface 31 of the photoreceptor 30 after a toner image is transferred.

The transfer apparatus 44 transfers the first toner 1 and the second toner 2 of the first and second toner images formed on the surface 31 of the photoreceptor 30 to a ceramic green sheet 4 which is an object to be printed.

The fixing apparatus 46 fixes the first toner 1 and the second toner 2 transferred to the ceramic green sheet 4 to form a predetermined resistance pattern 3 on the ceramic green sheet 4. For example, the fixing apparatus 46 may be a flash lamp.

The operation of the electrophotographic apparatus 20 will be described below.

First, while the photoreceptor 30 is rotated in the direction indicated by an arrow 38, the surface of the photoreceptor 30 is uniformly electrified at a constant potential (for example, negative charge) by the charger 32. Examples of the electrostatic charging include scorotron charging, roller charging, and brush charging.

The exposure apparatus 34 then irradiates the surface 31 of the photoreceptor 30 with light in response to a picture signal that corresponds to the resistance pattern to remove negative charges at the irradiated portion, thus forming an electric charge image (electrostatic latent image) that corresponds to the resistance pattern on the surface 31 of the photoreceptor 30. The light may be generated by a laser oscillator or a light-emitting diode (LED).

The first toner 1 containing a resistive material is then electrostatically deposited to the electrostatic latent image with the first developing unit 22 to form a visible image (first toner image).

The second toner 2 containing a resistive material is then electrostatically deposited to the electrostatic latent image with the second developing unit 24 to form a visible image (second toner image).

The first toner 1 and the second toner 2 in the developing units 22 and 24 are mixed with a carrier. The first toner 1 and the second toner 2 are charged negatively, and the carrier is charged positively. The first toner 1 and the second toner 2 are reversed onto the photoreceptor 30 with developing sleeves 23 and 25. The carrier is recovered from the developing sleeves 23 and 25 without falling off. More specifically, the carrier particles on the developing sleeves 23 and 25 stand up by magnetic force between carrier particles. The tip of the carrier particles sweeps over the surface 31 of the photoreceptor 30. The first toner 1 and the second toner 2 deposited on the tip of the carrier particles are deposited to the electrostatic latent image in a manner that depends on the electrostatic force balance between the carrier, the toner, and the photoreceptor, thus developing the toner image.

A carrier particle having a larger size is less likely to fall off the developing sleeves in the development, but in the case of using such a carrier particle it becomes more difficult to form the resistance pattern precisely. On the other hand, a carrier particle having a smaller size more easily falls off the developing sleeves, but it becomes easier to form the resistance pattern precisely. Thus, the carrier particle size is preferably in the range of 25 to 80 μm.

As in the toner, the carrier is also a magnetic substance, such as ferrite, coated with a resin. Preferably, the glass transition point $Tg^c$ or the glass softening point $Ts^c$ of the resin formed on the carrier is at least 20° C. higher than the fixing temperature of the toner. In other words, the glass transition point $Tg^c$ or the glass softening point $Ts^c$ is preferably at least 20° C. higher than the glass transition point $Tg^t$ or the glass softening point $Ts^t$ of the resin formed on the toner ($Tg^c \geq Tg^t+20°$ C. or $Ts^c \geq Ts^t+20°$ C.). This is because, when the glass transition point $Tg^c$ or the glass softening point $Ts^c$ is near or no more than the fixing temperature of the toner, carrier contaminants in the toner image are also fixed and are difficult to remove.

The developing units 22 and 24 are designed to control the density of the toner image, that is, the amount of the first toner 1 and the second toner 2 supplied to the photoreceptor 30. For example, the position or the magnetic field intensity of a magnet roller, which generates a magnetic field for supplying toner to the developing sleeves 23 and 25, is altered to control the amount of toner deposited on the developing sleeves 23 and 25.

Then, while the ceramic green sheet 4, which is positively charged by the transfer apparatus 44, is brought close to or into contact with the surface 31 of the photoreceptor 30, the ceramic green sheet 4 is conveyed in the direction indicated by an arrow 7 in synchronism with the rotation of the photoreceptor 30. Thus, the toner image (the first toner 1 and the second toner 2) formed on the surface 31 of the photoreceptor 30 is transferred to the surface 5 of the ceramic green sheet 4. More specifically, the toner image is transferred by a known method, such as a corona transfer method, a roller transfer method, or a belt transfer method.

While only the ceramic green sheet 4 is conveyed in this embodiment, a ceramic green sheet 4 formed on a carrier film may be conveyed together with the carrier film. Since the toner image can be transferred by a displacement of the ceramic green sheet 4 relative to the photoreceptor 30, the ceramic green sheet 4 may be fixed, and the electrophotography engine unit 40, the transfer apparatus 44, and the fixing apparatus 46 may be moved. Alternatively, both the ceramic green sheet 4 and the electrophotography engine unit 40 may be moved.

After the toner image is transferred to the ceramic green sheet 4, the first toner 1 and the second toner 2 remaining on the surface 31 of the photoreceptor 30 are removed by the cleaner 36 and are recovered.

The ceramic green sheet 4 to which the toner image is transferred is then conveyed to the fixing apparatus 46. The fixing apparatus 46 melts the resin layer formed on the first toner 1 and the second toner 2, and fixes the first toner 1 and the second toner 2, thus forming the resistance pattern 3. Fixing may be performed by any fixing method, such as heat roller fixing, oven fixing, flash fixing, or solvent fixing.

Before the toner transferred to the ceramic green sheet 4 reaches the fixing apparatus 46, the toner is preferably conveyed under a magnet for adsorbing a carrier (not shown). The magnet removes carrier particles possibly present in the toner before the toner is fixed, thus reducing variations in the resistance of the resistance pattern.

A predetermined number of ceramic green sheets on which the resistance pattern 3 is formed are then pressed together in a lamination process. The resulting laminate is then fired at a predetermined temperature in a firing process. While the ceramic green sheets are fired, the resin component in the resistance pattern 3 is eliminated, thus forming a ceramic multilayer board that includes a thick-film resistor and has consistent quality.

The electrophotographic apparatus 20 forms the first toner image and the second toner image on the common photoreceptor 30, thus easily aligning the first toner image and the second toner image with high precision. The first toner image and the second toner image can be appropriately combined to easily provide a resistance pattern having a desired resistance. Furthermore, the number of components of a mechanism for forming a toner image is reduced. This enhances miniaturization of the apparatus.

Embodiment 2-2

Figure 4:
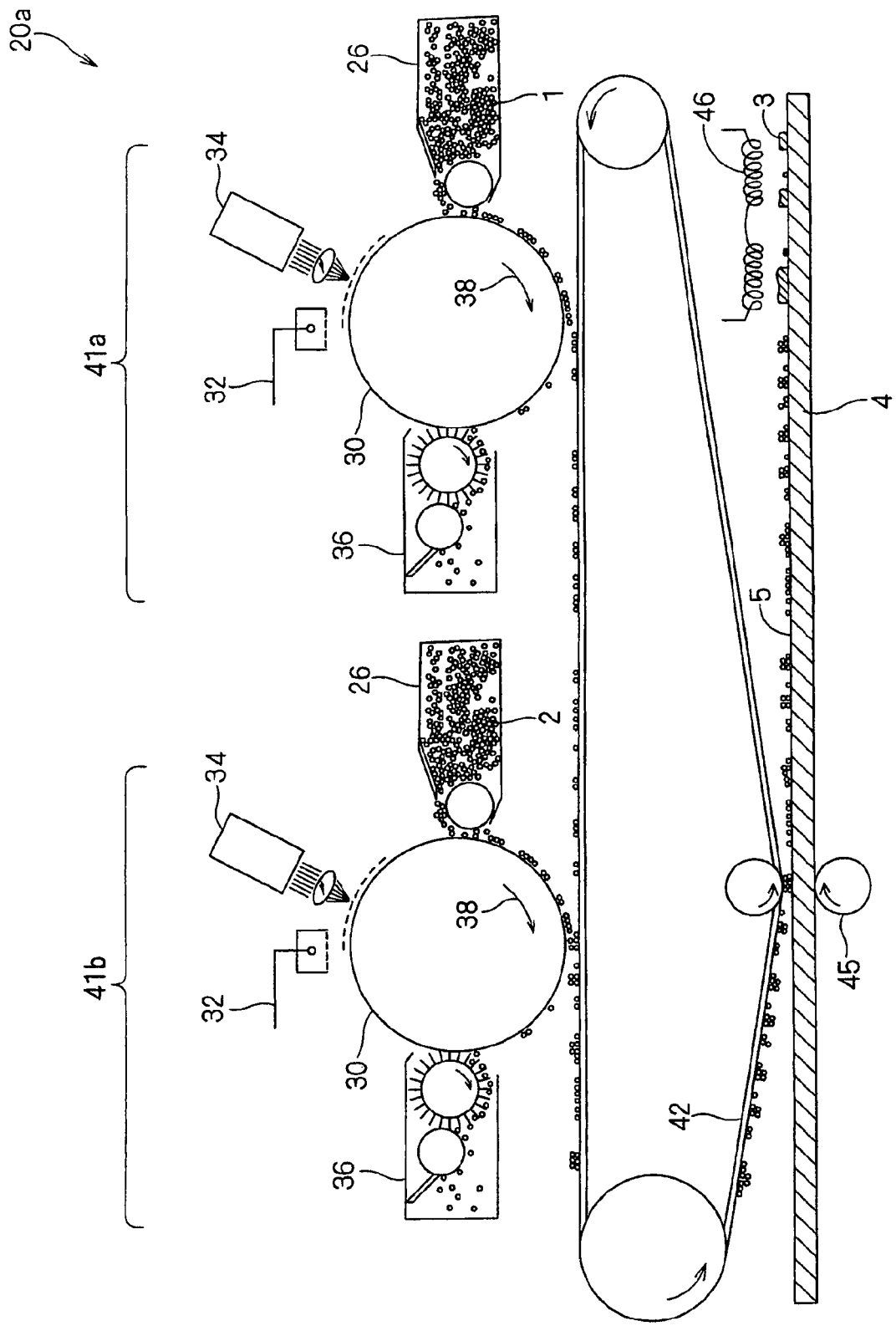
FIG. 4 is a schematic view of another electrophotographic printer. (Example 2-2)

FIG. 4 schematically illustrates the structure of another electrophotographic apparatus 20a that includes an intermediate transfer body.

As illustrated in FIG. 4, the electrophotographic apparatus 20a includes two sets of electrophotography engine units 41a and 41b. As in the single-drum-type electrophotographic apparatus 20 described above, each of the electrophotography engine units 41a and 41b includes a charger 32, an exposure apparatus 34, a developing unit 26 for supplying toner 1 or 2 to a drum-type photoreceptor 30, and a cleaner 36, each disposed around the photoreceptor 30.

However, unlike the single-drum-type electrophotographic apparatus 20, each of the photoreceptors 30 is provided with one developing unit 26. The electrophotographic apparatus 20a further includes an intermediate transfer body 42 between the photoreceptors 30 of the electrophotography engine units 41a and 41b and a ceramic green sheet 4.

The intermediate transfer body 42 may be an endless belt formed of a PET film. Each toner image formed on the surfaces 31 of the photoreceptors 30 in the electrophotography engine units 41a and 41b is temporarily transferred to the intermediate transfer body 42. The toner images transferred to the intermediate transfer body 42 are transferred by a transfer apparatus 45 to the surface 5 of the ceramic green sheet 4 at a time.

In the electrophotographic apparatus 20a, the first toner image and the second toner image can easily overlap each other.

Figure 5:
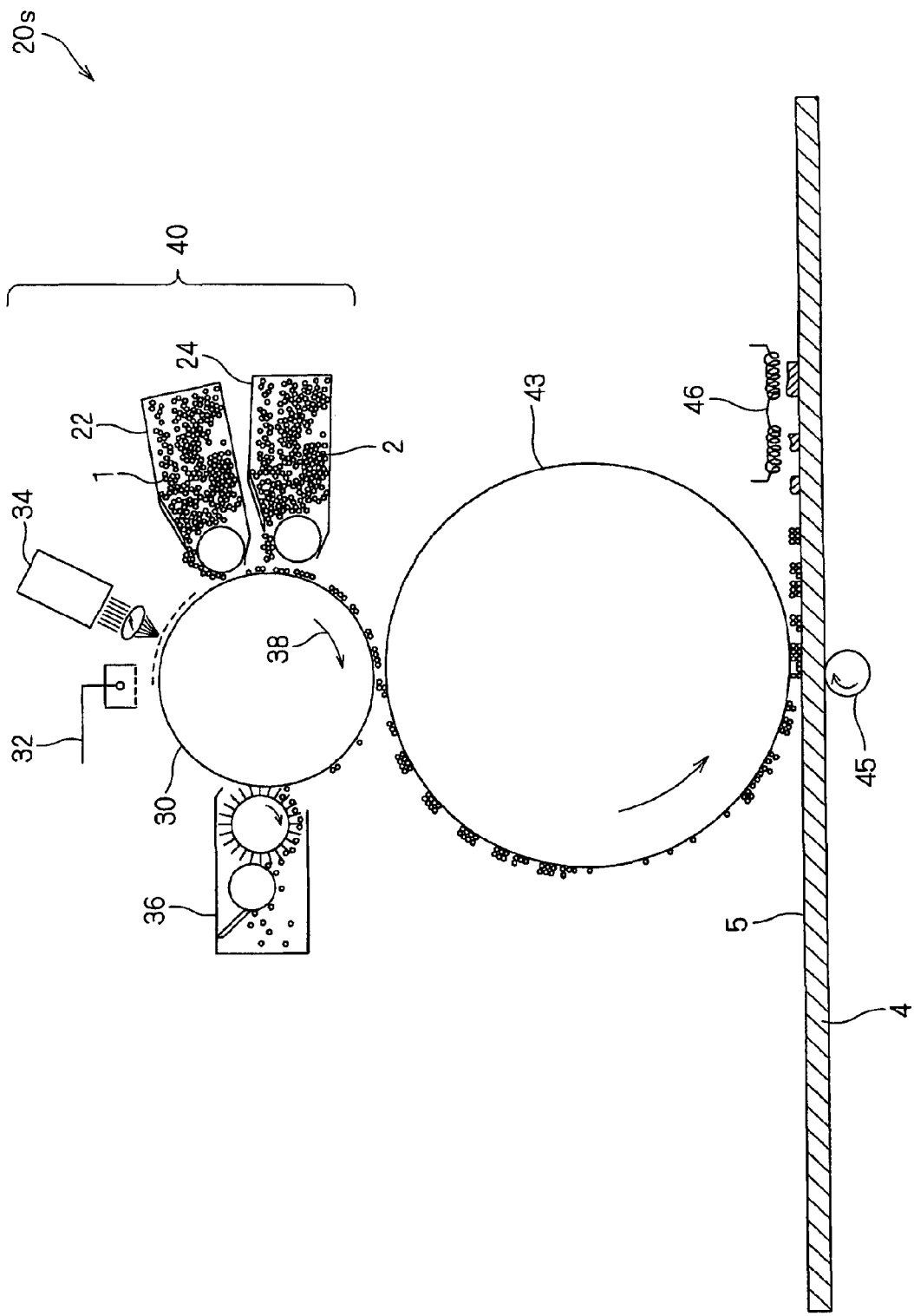
FIG. 5 is a schematic view of still another electrophotographic printer. (Modification of Example 2-2)

FIG. 5 schematically illustrates the structure of still another electrophotographic apparatus 20s.

As illustrated in FIG. 5, the electrophotographic apparatus 20s includes a drum-type intermediate transfer body 43 instead of the belt-type intermediate transfer body 42 (see FIG. 4). The electrophotographic apparatus 20s further includes one electrophotography engine unit 40 including two developing units 22 and 24, instead of two sets of electrophotography engine units 41a and 41b (see FIG. 4).

Embodiment 2-3

Figure 6:
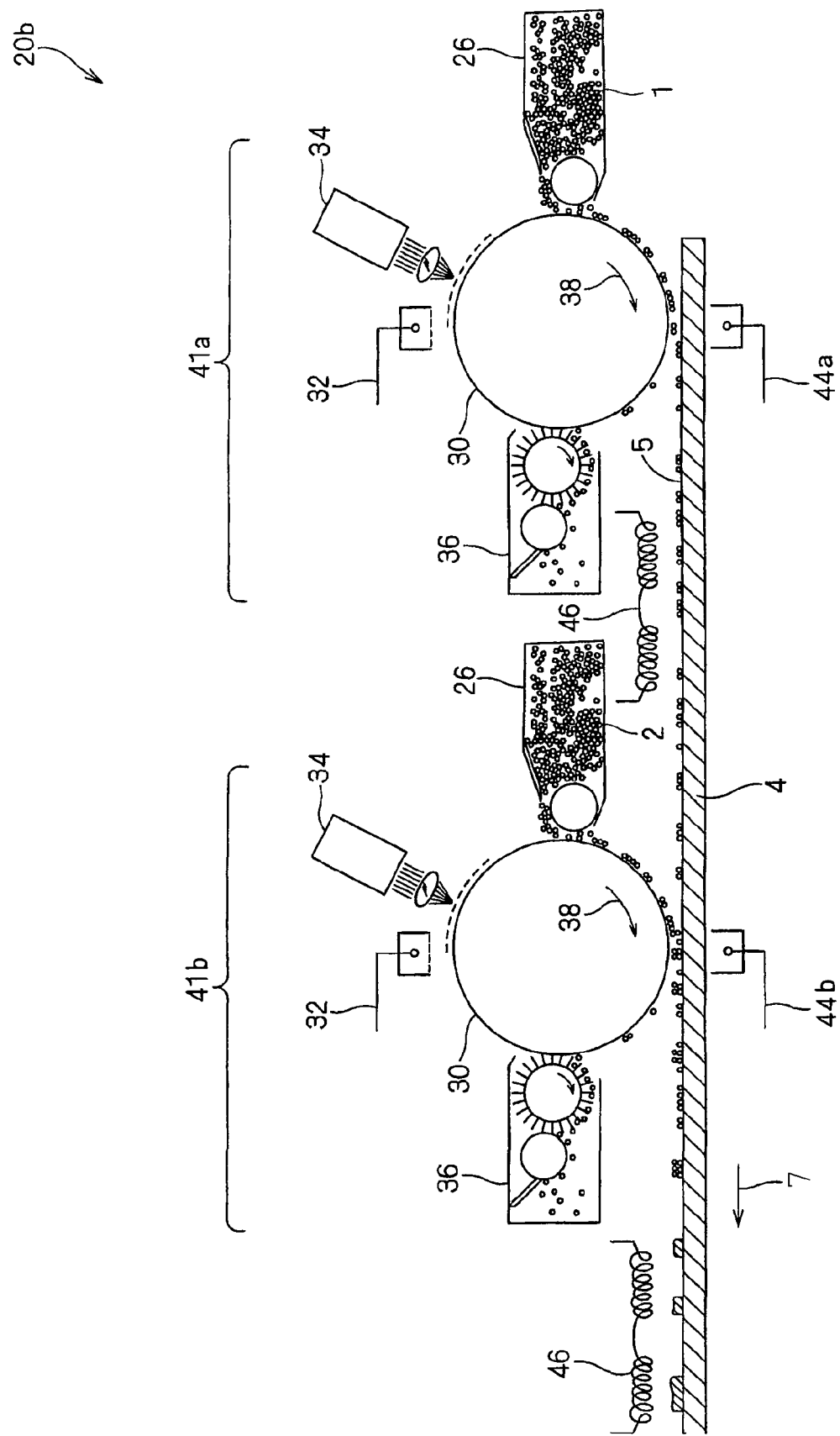
FIG. 6 is a schematic view of a further electrophotographic printer. (Example 2-3)

FIG. 6 schematically illustrates the structure of a two-drum-type electrophotographic apparatus 20b without an intermediate transfer body.

As illustrated in FIG. 6, the electrophotographic apparatus 20b includes two sets of electrophotography engine units 41a and 41b, two sets of transfer apparatuses 44a and 44b, and fixing apparatuses 46. The electrophotographic apparatus 20b conveys a ceramic green sheet 4 in the direction indicated by an arrow 7 in synchronism with the rotation of photoreceptors 30 in the direction indicated by arrows 38. A first toner image formed by the first electrophotography engine unit 41a is transferred to the ceramic green sheet 4 by the transfer apparatus 44a. A second toner image formed by the second electrophotography engine unit 41b is transferred to the ceramic green sheet 4 by the transfer apparatus 44b. The two toner images transferred to the ceramic green sheet 4 are fixed by a fixing apparatus 46.

In the electrophotographic apparatus 20b, since the first toner image and the second toner image are separately transferred and fixed, a first toner 1 forming the first toner image and a second toner 2 forming the second toner image are mixed negligibly. Thus, a first resistance pattern element resulting from the first toner image and a second resistance pattern element resulting from the second toner image can independently have a desired resistance without difficulty.

Embodiments of a resistance pattern formed by transferring and fixing a toner image with an electrophotographic apparatus will be described below with reference to FIGS. 7 to 14.

Embodiment 3-1

First, an embodiment of a resistance pattern formed by the application of a plurality of toner images will be described below with reference to FIGS. 7 and 11.

Figure 7A:
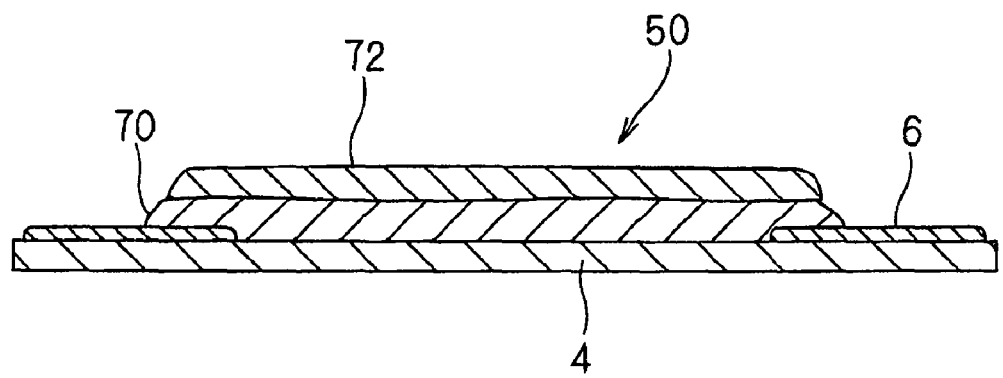
FIGS. 7(A) and 7(B) are respectively a cross-sectional view and a plan view illustrating the print state. (Example 3-1)
Figure 7B:
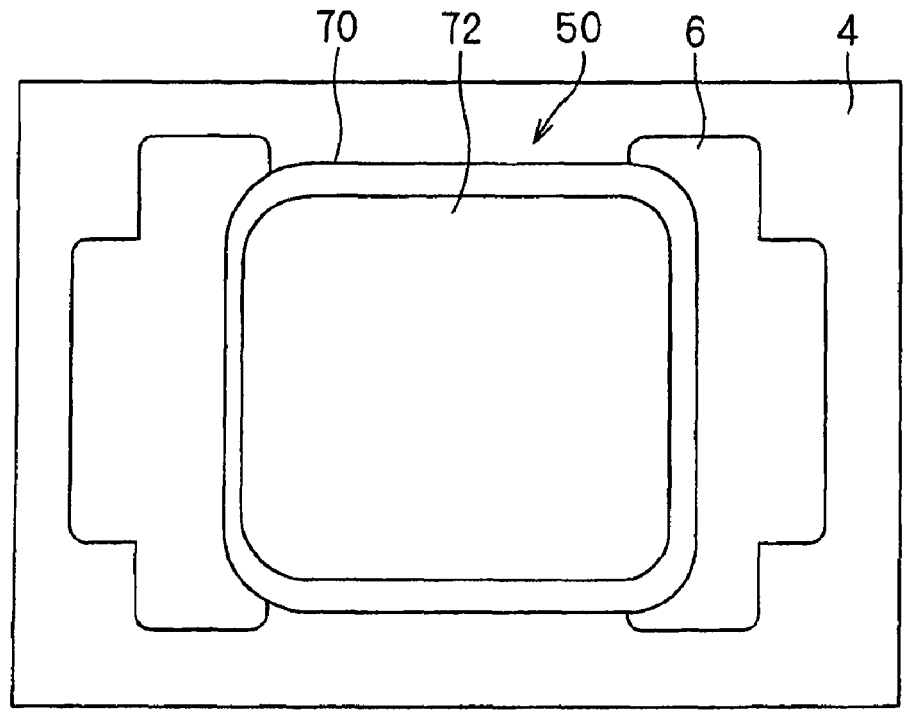

As illustrated in a cross-sectional view of FIG. 7(A) and a plan view of FIG. 7(B), a first resistance pattern element 70 resulting from a first toner image and a second resistance pattern element 72 resulting from a second toner image are layered on a ceramic green sheet 4 between a pair of electrodes 6 to form a resistance pattern 50. For example, the electrodes 6 are connected to through-hole conductors (not shown) passing through the ceramic green sheet 4. The electrodes 6 may be end faces of the through-hole conductors.

A second resistance pattern element 72 having a relatively small resistance can be formed on a first resistance pattern element 70 having a relatively large resistance to reduce the resistance of the thick-film resistor. The second resistance pattern element 72 may be partly removed by a laser to finely adjust the resistance of the resistance pattern 50 between the electrodes 6.

While the width of the second resistance pattern element 72 (the length in a direction parallel to the electrodes 6) is smaller than the width of the first resistance pattern element 70 in FIG. 7(B), these widths may be the same, and the element 70 and the element 72 may overlap each other completely.

Figure 8:
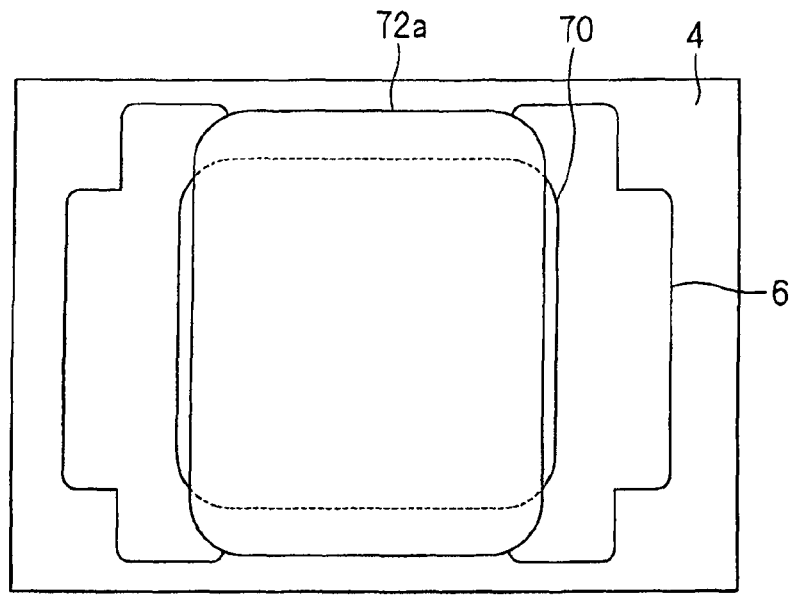
FIG. 8 is a plan view illustrating a modified print state. (Modification 1 of Example 3-1)

As illustrated in a plan view of FIG. 8, the width of a second resistance pattern element 72a may be larger than the width of the first resistance pattern element 70. In other words, both the first resistance pattern element 70 and the second resistance pattern element 72a may be connected to the electrodes 6.

Figure 9:
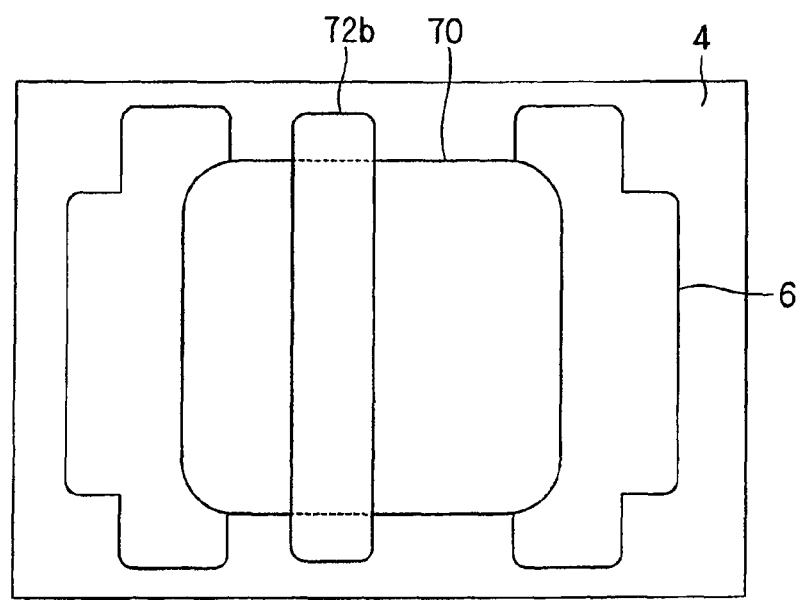
FIG. 9 is a plan view illustrating another modified print state. (Modification 2 of Example 3-1)

As illustrated in a plan view of FIG. 9, a strip of a second resistance pattern element 72b may be disposed on part of the first resistance pattern element 70. The strip of the second resistance pattern element 72b serves to hold the first resistance pattern element 70 to the ceramic green sheet 4.

Furthermore, the first resistance pattern element may overlap only with one electrode, the second resistance pattern element may overlap only with the other electrode, and the second resistance pattern element may overlap entirely or partly with the first resistance pattern element.

Figure 10:
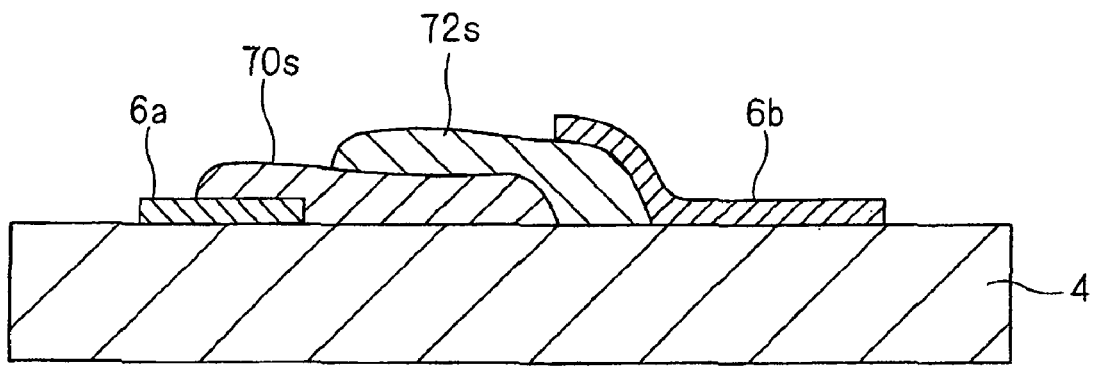
FIG. 10 is a cross-sectional view illustrating a further print state. (Modification 3 of Example 3-1)

Alternatively, as illustrated in a cross-sectional view of FIG. 10, a first resistance pattern element 70s may be partly disposed on one of the electrodes 6a, a second resistance pattern element 72s may be partly disposed on the first resistance pattern element 70s, and the other of the electrodes 6b may be partly disposed on the second resistance pattern element 72s. The electrode 6b may also be formed by electrophotography.

Figure 11:
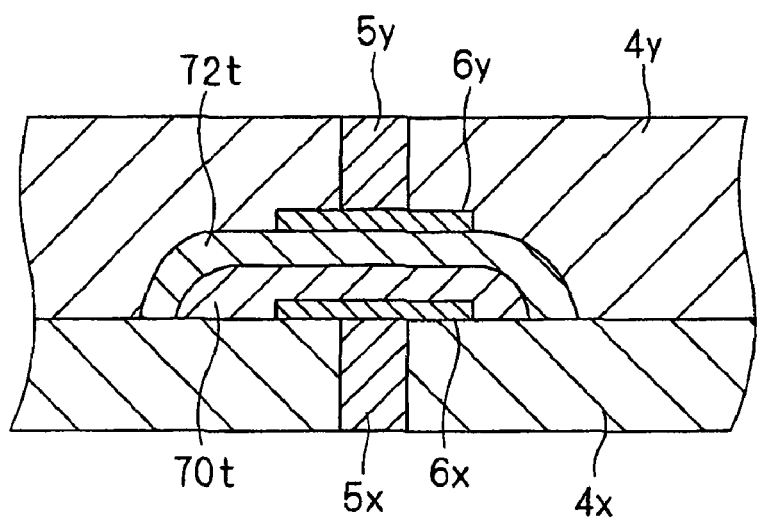
FIG. 11 is a plan view illustrating yet another print state. (Modification 4 of Example 3-1)

As illustrated in a cross-sectional view of FIG. 11, resistance pattern elements 70t and 72t may be layered between a pair of electrodes 6x and 6y facing each other in the thickness direction. The resistance pattern elements 70t and 72t may be connected to the electrodes 6x and 6y in series.

Such a structure may be produced by forming the resistance pattern elements 70t and 72t on the electrode 6x disposed on the ceramic green sheet 4x and placing a ceramic green sheet 4y including the electrode 6y thereon.

The electrodes 6x and 6y are connected to through-hole conductors 5x and 5y passing through the ceramic green sheets 4x and 4y. The resistance pattern elements 70t and 72t may be connected directly to the through-hole conductors 5x and 5y without the electrodes 6x and 6y.

When the resistance pattern elements are connected in series between the electrodes, the resistance of a resistance pattern between the electrodes can be designed easily.

When resistance pattern elements resulting from toner images are layered, mixing between the toner of the first resistance pattern element and the toner of the second resistance pattern element should be minimized, because the mixing makes the design of resistance difficult. Thus, the fixing of the first toner image and the second toner image, which produces the first resistance pattern element and the second resistance pattern element, respectively, are preferably performed separately, for example, with the electrophotographic apparatus 20b illustrated in FIG. 6.

Embodiment 3-2

A tessellated toner image will be described below with reference to FIGS. 12(A) and 12(B).

Figure 12A:
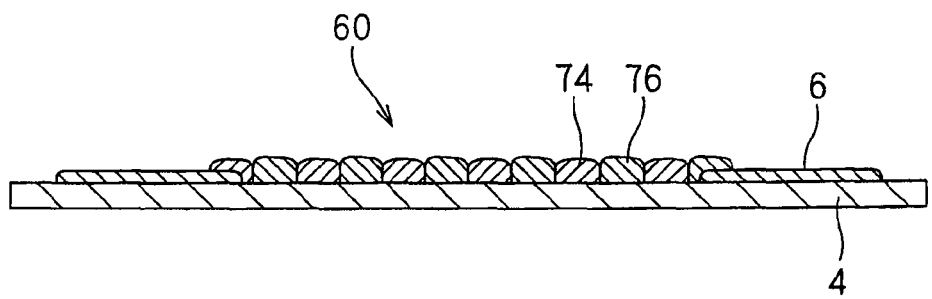
FIGS. 12(A) and 12(B) are respectively a cross-sectional view and a plan view illustrating another print state. (Example 3-2)
Figure 12B:
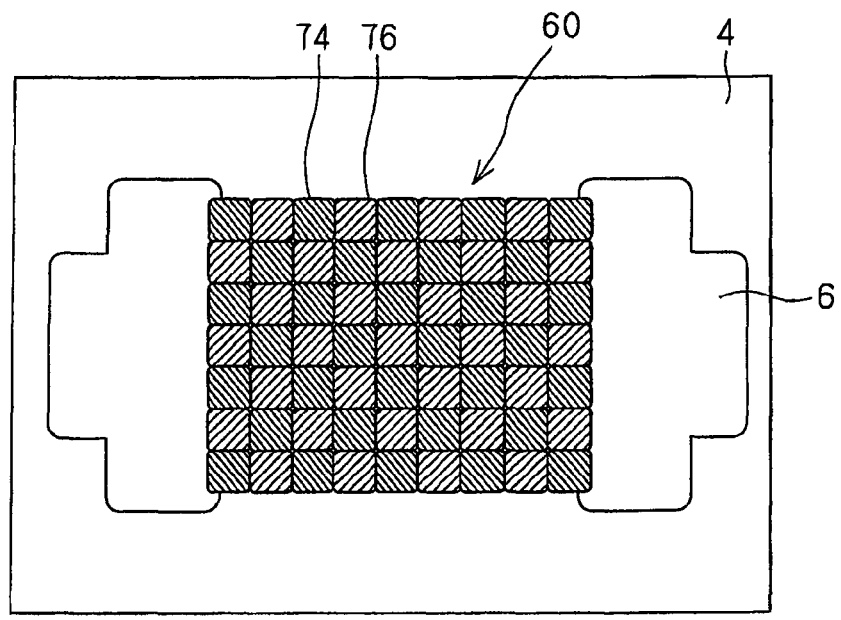

As illustrated in a cross-sectional view of FIG. 12(A) and a plan view of FIG. 12(B), a plurality of first pieces of first resistance pattern elements 74 resulting from a first toner image and a plurality of second pieces of second resistance pattern elements 76 resulting from a second toner image are alternately placed on a ceramic green sheet 4 between a pair of electrodes 6 in a substantially lattice pattern such that the first pieces and the second pieces are adjacent to each other, thus forming a tessellated resistance pattern 60.

The tessellated resistance pattern 60 can have a reduced thickness. The tessellated resistance pattern 60 can also have a substantially uniform resistance over the ceramic green sheet 4.

While the shape of the pieces of the resistance pattern elements 74 and 76 is substantially square in FIG. 12(B), it may be substantially triangular, substantially rectangular, substantially polygonal, such as pentagonal or hexagonal, or a complicated shape like a jigsaw puzzle. Adjacent pieces are at least partly in contact with each other. Thus, the boundary may include a gap, or adjacent pieces may overlap each other.

The size of pieces of the resistance pattern elements 74 and 76 is preferably in the range of about 20 μm×20 μm to about 2 mm×2 mm when the resolution of the toner image is 1200 dpi. Smaller pieces of the resistance pattern elements 74 and 76 result in a finer mixed state of the resistance patterns 74 and 76 and a more uniform resistance over the ceramic green sheet 4.

Embodiment 3-3

Figure 13A:
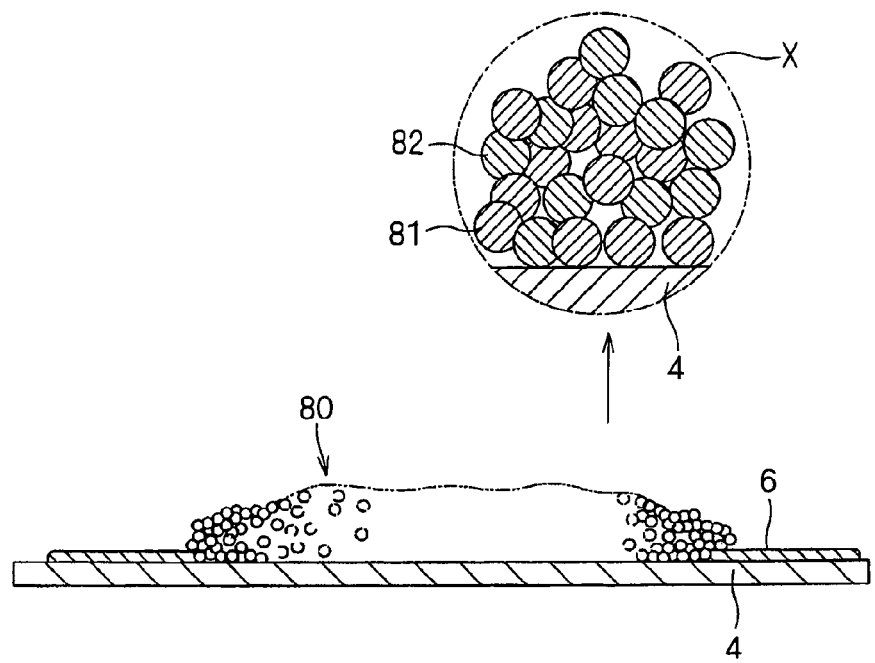
FIGS. 13(A) and 13(B) are respectively a cross-sectional view and a plan view illustrating yet another print state. (Example 3-3)

In this embodiment, different types of toner are mixed to form a resistance pattern, as illustrated in FIGS. 13(A), (B) and 14(A), (B).

Figure 13B:
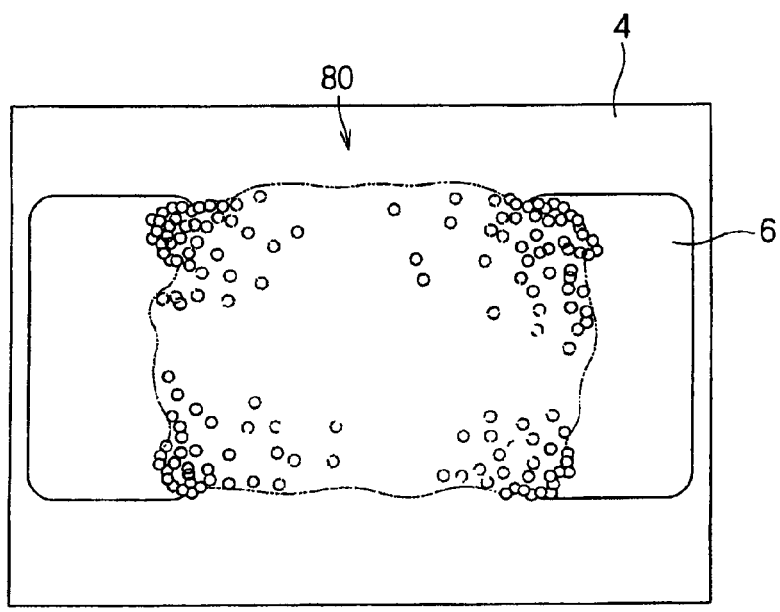

As illustrated in a cross-sectional view of FIG. 13(A) and a plan view of FIG. 13(B), a mixed toner layer 80 is formed on a ceramic green sheet 4 between a pair of electrodes 6. As illustrated in an enlarged view indicated by reference numeral X in FIG. 13(A), first toner 81 and second toner 82 are mixed in the mixed toner layer 80.

Figure 14A:
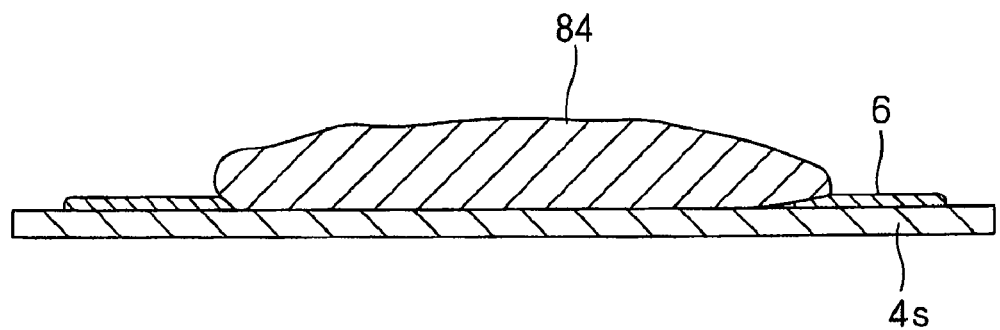
FIGS. 14(A) and 14(B) are respectively a cross-sectional view and a plan view illustrating the sintering state. (Example 3-3)
Figure 14B:
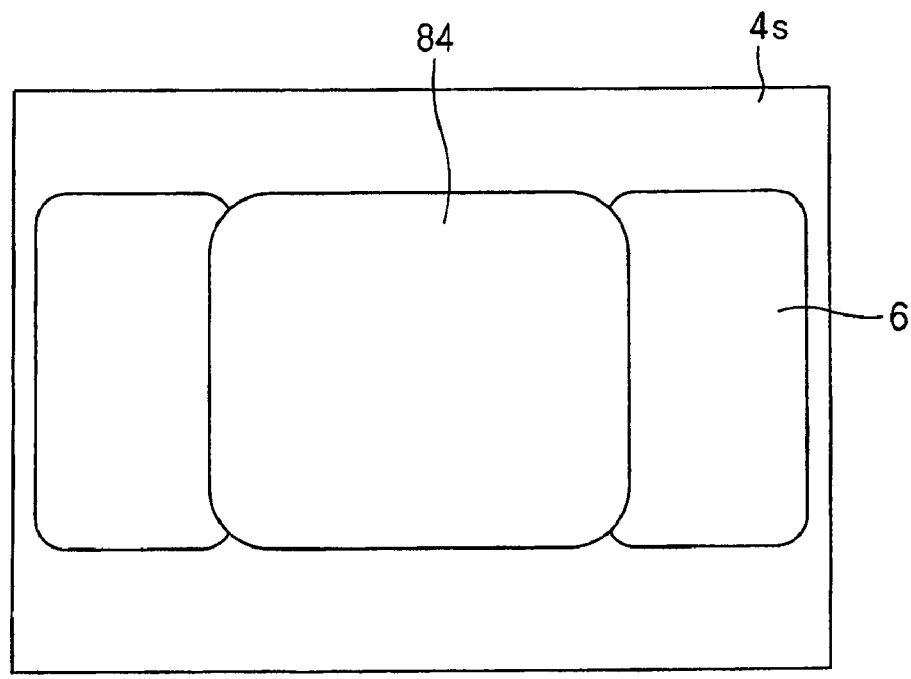

As illustrated in a cross-sectional view of FIG. 14(A) and a plan view of FIG. 14(B), the mixed toner layer 80 can be sintered to form a resistance pattern 84 on a ceramic substrate 4s between the pair of electrodes 6. The resistance pattern 84 has a substantially uniform resistance.

The resistance of the resistance pattern 84 can be controlled by the proportion of the first toner 81 to the second toner 82 in the mixed toner layer 80.

The mixed toner layer 80 may be formed with the single-drum-type electrophotographic apparatus 20 or 20s illustrated in FIG. 3 or 5. In this case, the number of developing units 22 and 24 may be increased to increase the number of toner images.

Alternatively, the mixed toner layer 80 may be formed with a developing unit in which the first toner and the second toner are independently supplied to a developing sleeve and the resulting toner mixture is supplied from the developing sleeve to a photoreceptor. If the toner flies to the developing sleeve by electromagnetic force, the electric field intensity or the magnetic field intensity may be controlled to adjust the amount of toner easily. The toner may be blown in the airstream against the developing sleeve.

CONCLUSIONS

As described above, a plurality of types of toner having different resistances can be combined to easily form a resistance pattern having a desired resistance by electrophotography. More specifically, various types of toner can be combined in different ratios to form resistance patterns having different resistances. It is sufficient for the formation of the resistance pattern to store only limited types of toner having different resistances.

When conductor toner and glass toner are combined, the resistance of a resistance pattern depends on the content of the conductor toner 12. Thus, the resistance is easy to estimate. In this case, the available resistance range of a resistance pattern is relatively wide.

By contrast, when low-resistance toner and high-resistance toner are combined, the available resistance range of a resistance pattern is relatively narrow. However, the low-resistance toner and the high-resistance toner can be combined to finely adjust the resistance of a circuit pattern.

When a single layer includes a plurality of resistance patterns having different resistances, in a method in which resistive paste is printed, the resistance control of the resistive paste and the manufacture of a printing plate must be performed for every resistance pattern. By contrast, a single layer can be printed in a single step by electrophotography. Thus, a ceramic board can be manufacture for a short period of time and at low costs.

Furthermore, in a method in which resistive paste is printed, if printing is performed on a single ceramic green sheet while replacing a printing plate and resistive paste a plurality of times, the ceramic green sheet must be dried the same number of times. The drying shrinkage (percentage) of the ceramic sheet varies with the number of drying cycles. In a plurality of ceramic green sheets constituting a ceramic board, different numbers of drying cycles of the ceramic green sheets may result in variations in the size of the ceramic green sheets. This may cause misalignment of the ceramic green sheets. By contrast, since a single layer is printed at a time by electrophotography, the misalignment can be avoided. Thus, a high-quality ceramic board can be manufactured.

Furthermore, electrophotography requires no printing plate and can therefore reduce the plate exchange time, the plate cleaning time, and all the costs associated with a plate, including the plate cost. In addition, electrophotography also does not need a period of time for a plate to be manufactured. Hence, an inexpensive ceramic board can be provided within a short period of time.

In a method in which resistive paste is printed, a previously blended resistive paste must be prepared. Thus, the blend paste must be stored carefully so as not to cause deterioration in quality, such as gelation or separation. Electrophotography can remove such burdens.

A method for forming a circuit pattern according to the present invention is not limited to these embodiments, and various modifications can be made.

For example, types of toner having different resistances are not limited to two types as described above. For example, four types of toner having resistance of 10, 100, 1000, or 10000 (ohms per square) respectively may be supplied to a printer.

Furthermore, the resistive material is not limited to ruthenium oxide, which can fired in an oxidizing atmosphere. For example, niobium lanthanum (NbLa), which can be fired in a reducing atmosphere, may also be suitably used.

Furthermore, in place of the mechanical coating using a hybridization system (Nara Machinery Co., Ltd.) described above, a method for manufacturing toner may be another known method, such as a direct polymerization method, a precipitation polymerization method, a phase-inversion emulsification method, and a pulverization method.

Likewise, the development method is not limited to dry-type two-component development using a developer that contains toner and a carrier described above, and may be a dry-type single-component magnetic development method, a dry-type single-component nonmagnetic development method, or a wet development method.

The object to be printed is not limited to a ceramic green sheet, and may be a fired ceramic substrate or another substrate formed of a material other than ceramics. The present techniques can be applied to not only a resistance pattern serving as a resistance element, but also a circuit pattern including wiring serving as an inductor and/or a capacitor electrode.

Although particular embodiments have been described, many other variations and modifications and other uses will become apparent to those skilled in the art. Therefore, the present invention is not limited by the specific disclosure herein.

What is claimed is:

1. A method for forming a circuit pattern, comprising:
a first step of forming by electrophotography a first toner image on a surface using a first toner, and a second toner image on the surface using a second toner, the first toner containing a resistive material, the second toner having a resistance different from that of the first toner; and
a second step of transferring and fixing the first toner image and the second toner image from the surface to an object to be printed to form the circuit pattern; wherein
the first toner is a conductor-containing toner having resistor particles coated with a resin layer; and
the second toner is a glass-containing toner having glass particles coated with a resin layer; or wherein
the first toner is a toner for forming a low-resistance pattern having resistor particles, glass frit disposed on the surface of the resistor particles, and a resin layer disposed around the resistor particles, and
the second toner is a toner for forming a high-resistance pattern having resistor particles, glass frit disposed on the surface of the resistor particles, and a resin layer disposed around the resistor particles,
the amount of the glass frit in the second toner being larger than that in the first toner.

2. The method for forming a circuit pattern according to claim 1, wherein the resin layer of at least one of the conductor-containing toner or the glass-containing toner contains a charge control agent.

3. The method for forming a circuit pattern according to claim 1, wherein the resin layer of at least one of the toner for forming a low-resistance pattern or the toner for forming a high-resistance pattern contains a charge control agent.

4. The method for forming a circuit pattern according to claim 1, wherein, in the first step, the first toner and the second toner are deposited on a common photoreceptor to form the first toner image and the second toner image, respectively, and
in the second step, the first toner image and the second toner image formed on the photoreceptor are transferred at the same time to be fixed to the object to be printed.

5. The method for forming a circuit pattern according to claim 1, wherein, in the first step, the first toner is used to form the first toner image on a photoreceptor, and the second toner is used to form the second toner image on another photoreceptor, and
in the second step, the first toner image and the second toner image are transferred to a common intermediate transfer body, and the first toner image and the second toner image transferred to the intermediate transfer body are then transferred to the object to be printed.

6. The method for forming a circuit pattern according to claim 1, wherein, in the second step, the first toner image is transferred and fixed, and then the second toner image is transferred and fixed.

7. The method for forming a circuit pattern according claim 1, further comprising the steps of:
connecting a first circuit pattern element, which is formed by transferring and fixing the first toner image, between a pair of electrodes disposed on the object to be printed, and
placing a second circuit pattern element, which is formed by transferring and fixing the second toner image, on at least part of the first circuit pattern element.

8. The method for forming a circuit pattern according to claim 1, comprising the steps of:
connecting a first circuit pattern element, which is formed by transferring and fixing the first toner image, to one of a pair of electrodes disposed on the object to be printed,
connecting a second circuit pattern element, which is formed by transferring and fixing the second toner image, to the other of the pair of electrodes disposed on the object to be printed, and
placing the second circuit pattern element on at least part of the first circuit pattern element.

9. The method for forming a circuit pattern according to claim 1, comprising the steps of:
alternately placing a plurality of first pieces of a first circuit pattern element, which are formed by transferring and fixing the first toner image, and a plurality of second pieces of a second circuit pattern element, which are formed by transferring and fixing the second toner image, such that the first pieces and the second pieces are adjacent to each other over the object to be printed.

10. The method for forming a circuit pattern according to claim 1, wherein, in the first step, the first toner image and the second toner image are layered such that the first toner is mixed with the second toner.

11. The method for forming a circuit pattern according to claim 1, wherein the object to be printed is a ceramic green sheet.

12. The method for forming a circuit pattern according to claim 11, further comprising:
a third step of laminating a plurality of ceramic green sheets, including the ceramic green sheet on which the circuit pattern is formed, to form a laminate; and
a fourth step of firing the laminate together with the circuit pattern.

* * * * *